United States Patent
Holzer et al.

[11] Patent Number: 6,132,676
[45] Date of Patent: Oct. 17, 2000

[54] MINIMAL THERMAL EXPANSION, HIGH THERMAL CONDUCTIVITY METAL-CERAMIC MATRIX COMPOSITE

[75] Inventors: Hermann Holzer, Vienna, Austria; David C. Dunand, Evanston, Ill.

[73] Assignees: Massachusetts Institute of Technology, Cambridge, Mass.; Electrovac GESMBH, Klosterneuburg, Austria

[21] Appl. No.: 08/885,230

[22] Filed: Jun. 30, 1997

[51] Int. Cl.[7] .................................................. B22F 1/02
[52] U.S. Cl. ................... 419/20; 419/35; 419/49
[58] Field of Search .................... 419/35, 20, 49

[56] References Cited

U.S. PATENT DOCUMENTS

| | | | |
|---|---|---|---|
| 4,836,979 | 6/1989 | Bell et al. | 419/23 |
| 4,894,293 | 1/1990 | Breit et al. | 428/614 |
| 4,999,336 | 3/1991 | Nadkarni et al. | 505/1 |
| 5,039,335 | 8/1991 | Gondusky et al. | 75/246 |
| 5,058,799 | 10/1991 | Zsamboky | 228/124 |
| 5,224,017 | 6/1993 | Martin | 361/388 |
| 5,601,924 | 2/1997 | Beane et al. | 428/403 |

FOREIGN PATENT DOCUMENTS

| | | |
|---|---|---|
| 63-286537 | 11/1988 | Japan. |
| 03075240 | 3/1991 | Japan. |

OTHER PUBLICATIONS

C. Verdon et al., "High–Temperature Reactivity in the $ZrW_2O_8Cu$ System,"pp. 1075–1080, Scripta Materialia, vol. 36, No. 9, 1997.

*Primary Examiner*—Daniel J. Jenkins
*Attorney, Agent, or Firm*—Wolf, Greenfield & Sacks, P.C.

[57] ABSTRACT

The invention provides techniques for forming composites including $XW_2O_8$, where X=Zr, Hf, or a combination, dispersed within a continuous, metal matrix. A low to zero coefficient of thermal expansion material, with high thermal and electrical conductivity, results. One method for forming the composite involves coating particles of $XW_2O_8$ with a layer of metal, then isostatically pressing the particles under conditions amenable to formation of a composite. The technique of coating, with a more malleable phase, a phase that undergoes a disadvantageous phase transformation of decomposition upon exposure to a threshold pressure at a set temperature can be applied to a variety of materials.

33 Claims, 6 Drawing Sheets

MINIMAL THERMAL EXPANSION, HIGH THERMAL CONDUCTIVITY METAL-CERAMIC MATRIX COMPOSITE

FIELD OF THE INVENTION

The present invention relates generally to metal/ceramic composites, and more particularly to a composite having low or zero coefficient of thermal expansion and high thermal conductivity made of a discontinuous, negative thermal coefficient ceramic in a continuous metal matrix.

BACKGROUND OF THE INVENTION

The coefficient of thermal expansion (CTE) of a material is a factor representative of the degree to which a particular material expands (if a material has a positive CTE) or contracts (if a material has a negative CTE) as it is heated. Most materials have a positive CTE, and expand upon heating.

Materials having low or zero CTEs are useful as structural components in a variety of settings. For example, in fields such as high-power electronics, space optics, precision measurement devices, and the like, where precise measurements, tolerances, positions, and/or shapes of structural components is critical, the use of structural components having low or zero CTE is highly desirable, especially in situations in which the components are exposed to a variety of temperatures. In systems such as these, if structural components have higher CTEs, then as the temperature of the components varies, the components expand or contract, potentially disrupting measurements, settings, relationships between components, etc.

In many cases it is desirable that these components also be highly thermally conductive, such as in electronics thermal management, where high thermal conductivity and a low, tailorable coefficient of thermal expansion (CTE) are needed. For example, in the case of a substrate or a semiconductor chip used in relatively high-power electronics, the chip will generate significant heat and it is desirable that the substrate have high thermal conductivity to remove the heat from the chip.

Composites of metals and CTE-modifying additives find use in electronics thermal management applications. The metal component provides thermal and/or electrical conductivity, and the additive, which can be a ceramic with a CTE much lower than that of the metal, lowers the overall CTE of the composite. Because increasing the ceramic additive content generally decreases the thermal conductivity of the composite, it is desirable to use ceramic additives with CTEs as low as possible to minimize the required volume fraction of additive for a given composite, and thus maximize composite conductivity. Ceramics with negative CTEs thus are particularly attractive, and also provide the opportunity for thermally-conductive metal/ceramic composites with zero isotropic CTE (where the negative CTE of the ceramic offsets the positive CTE of the metal) for applications in precision optics and measurements.

Composites of the general type described above typically have been made by grinding components to fine powders, combining and mixing the powders, and applying pressure to the mixture, heating the mixture, or both. Most typically, a powder mixture is sintered or calcined at relatively high temperature, optionally with pressure, to form a composite. Sintering of copper typically takes place above 800° C. Hot isostatic pressing of copper is normally carried out a temperatures above 600° C.

U.S. Pat. No. 4,098,725 (Yamamoto) describes sintered ceramics including a low-thermally-expansive ceramic or negatively-thermally-expansive ceramic, having dispersed thereinto substantially in a continuous state an electroconductive substance such as a metal, carbon, a cermet, metal nitride, metal oxide, etc. A ceramic phase into which a phase of the electroconductive substance is dispersed is one of a variety of materials such as oxides. Yamamoto report mixing powders, then baking or calcining them at a variety of temperatures up to 1600° C.

U.S. Pat. No. 4,894,293 (Breit) describes a substrate for mounting a semiconductor device. The substrate includes a composite metal material comprising a plurality of discrete elements of ferrous metal material having a relatively low CTE, the discrete elements being copper-coated and pressed and sintered. The copper-coated elements also can be diffusion-bonded together. Breit reports that an article characterized by an improved combination of thermal expansion and conductivity properties results.

U.S. Pat. No. 5,039,335 (Gondusky) describes a composite metal material including a ferrous metal of relatively low thermal expansion properties and a silver metal, substantially free of ferrous constituents, having a relatively high thermal conductivity. The material purportedly has an effective thermal expansion coefficient corresponding to that of various silicon or gallium arsenide semiconductor devices. The low expansion ferrous material can be combined with the silver metal material while the silver metal material is heated and melted to secure the silver metal to the ferrous metal to form the composite. Alternatively, the ferrous powder particles can be pressed together and heated for diffusion bonding or sintering to each other to form a continuous, porous matrix. The silver metal then can be melted and introduced into the pores of the ferrous metal. Alternatively, the powders of the ferrous and silver metal materials can be mixed together and heated for bonding. Gondusky exemplifies Invar ferrous metal alloy, combined and mixed with particles of silver, and pressed and heated at a temperature of 960° C. Also exemplified is a process involving heating and pressing together Invar particles at a temperature of about 1300° C. to sinter them and to form a porous matrix, then introducing melted silver at 960° C. into the pores to form a composite.

U.S. Pat. No. 5,322,559 (Sleight) describes incorporation of negative CTE materials into epoxy and ceramic compositions. Negative CTE materials such as $ZrV_2O_7$, $ZrVP_2O_7$, $HfVPO_7$, etc. are combined with epoxy to form epoxy compositions.

U.S. Pat. No. 4,999,336 (Nadkarni) describes a dense powdered metal composite including discrete microparticles of a refractory metal oxide dispersed within a highly thermally or electrically conductive metal or alloy matrix. The composites purportedly are characterized by high thermal or electrical conductivity and a desired property such as controlled thermal expansion, high strength, wear and arc erosion resistance, etc. Nadkarni states that critical to his invention is the use of dispersion strengthened material, as well as hot isostatic pressing or hot extruding at temperatures of, for example, 1750° F. (954° C.) and 1650° F. (899° C.). Nadkarni notes that, at these temperatures, which he reports to be lower than typical prior art sintering temperatures, interdiffusion of atoms, or alloying, between the principle components is reduced.

In an article entitled "The Coefficient of Thermal Expansion of a Super Invar-$Ta_{16}W_{18}O_{94}$ Composite" (*J. Eng. Mat. Tech.*, Vol. 108, 270–274, July (1986)), Chu, et al. describes formation of a metal-ceramic composite of $Ta_{16}W_{18}O_{94}$ and Super Invar powders using powder metallurgy techniques.

Chu, et al. report a CTE of $1.1 \times 10^{-6}$ K$^{-1}$ of a mixture of constituent powders hot pressed at 1123 K (850° C.) for ten minutes.

Zirconium tungstate ($ZrW_2O_8$) and hafnium tungstate ($HfW_2O_8$) show strong negative CTEs from 0.3 K up to their decomposition temperatures of approximately 1050 K (777° C.). $ZrW_2O_8$ was discovered to have a very low CTE as early as 1968 (Martinek and Hummel, *J. Am. Ceram. Soc.*, 51, 227 (1968)). These materials, however, have limited stability at temperatures and pressures typical of composite formation (Evans, et al. "Compressibility, Phase Transitions, and Oxygen Migration in Zirconium Tungstate, $ZrW_2O_8$", *Science*, Vol. 275 (1997), 61; Evans, et al. "Negative Thermal Expansion in $ZrW_2O_8$ and $HfW_2O_8$", *Chem. Mater.*, 8, 12, 2809–2823, (1996); Mary, et al., "Negative Thermal Expansion from 0.3 to 1050 Kelvin in $ZrW_2O_8$", *Science*, Vol. 272, 90–92, Apr. 5, 1996). While Mary, et al., report that these materials are finding applications as components in composites in order to reduce the composites' overall thermal expansion to near zero, Verdon, et al., in "High-Temperature Reactivity in the $ZrW_2O_8$—Cu System", *Scripta Materialia*, Vol. 36, No. 9, 1075–1080 (1997), Elsevier, report difficulty in forming such composites. Verdon, et al. report that zirconium tungstate is metastable at room temperature and decomposes into the base oxides $Zr_2O_2$ and $WO_3$ when heated above 750° C. in air. Verdon, et al. explored the stability of zirconium tungstate when hot isostatically pressed with copper, in order to explore the processing feasibility of a low thermal expansion, high conductivity zirconium tungstate-copper composite. The result was reaction between the two phases to produce a composite consisting of complex oxides (containing Cu, Zr and W) within a copper matrix with $Cu_2O$ precipitates. Heat treatment of $ZrW_2O$—Cu mixture at 600° C. under vacuum, with no stress applied, resulted in partial decomposition of the ceramic. Decomposition products include zirconium oxide and various tungsten oxides. Verdon, et al, theorized that decomposition was due to loss of oxygen from the ceramic due to heating, leading to the formation of $Cu_2O$, followed by copper diffusion into the ceramic to form new oxides that absorb oxygen upon cooling.

U.S. Pat. No. 5,601,924 (Beane) describes techniques for forming composite articles of at least two materials in a predetermined ratio. Rather than mixing particles of a first component with particles of a second component, in a predetermined ratio, and forming a composite by pressing, sintering, or the like, particles of the first component are coated with particles of the second component to form coated particles of a predetermined ratio of the first component to the second component. Then, the coated particles are consolidated to cause them to be joined together to form an article. Bean uses primarily cold pressing, without heat, to form composites, optionally with a chemical reducing agent. The resultant article, as a whole, has a selected volume fraction according to the volumes of the respective components in the coated particles. The particles can be made of material such as tungsten, molybdenum, graphite, silicone carbide, diamond, nickel, KOVAR, or a ceramic. The coating can be, for example, copper, aluminum, or the like. The selected ratio of the first component and second component, determined by the degree of particle coating, can provide a selected intrinsic property of the overall resultant composite article. Thermal conductivities and coefficients of thermal expansion are properties that purportedly can be controlled according to the technique. Formation of a composite article from the coated particles can involve compaction, followed by sintering. Beane reports, for example, copper-coated tungsten particles compacted in a press at 200 tons per sq. in. of surface area followed by solid-state sintering in a hydrogen atmosphere at 1950° F. (1065° C.). Beane describes another embodiment in which particles that are chemically reactive with a second material are pre-coated, then the particles and matrix material are consolidated.

The above reports are representative of developments that, in some cases, provide suitable materials for a variety of uses. However, a need exists for improved materials having low CTEs and acceptable thermal conductivity.

SUMMARY OF THE INVENTION

The invention provides densified, zero to low CTE, high thermally conductivity materials. Methods and composite articles are provided.

In one aspect, the invention provides a method of forming a composite article. A first component is provided. The first component, when provided homogeneously and subjected to conditions of a threshold pressure at a set temperature, undergoes a phase transformation or decomposition affecting density, coefficient of thermal expansion, thermal conductivity, electrical conductivity, or a combination. Particles of the first component are substantially completely coated with a second component to form coated particles. Then, a densified composite article is formed from the coated particles.

The composite article can be tailored to have a high thermal conductivity and a desired coefficient of thermal expansion. The coefficient of thermal expansion can, if desired, be near zero or, essentially, zero.

In one embodiment the invention provides a method involving combining a first component that is a metal having high thermal conductivity with a second component having a coefficient of thermal expansion less than about $-3 \times 10^{-6}$/K and low thermal conductivity. A composite article is formed having a coefficient of thermal expansion of between about $-3 \times 10^{-6}$/K and about $7 \times 10^{-6}$/K and a thermal conductivity of at least about 100 W/m•K.

In another embodiment, the invention provides a method involving carrying out hot isostatic pressing with a copper matrix at a temperature of less than about 600° C.

In another aspect, the invention provides composite articles. One article is a composite article including a first component that, when provided homogeneously and subjected to conditions of a threshold pressure at a set temperature, undergoes a phase transformation or decomposition affecting density, coefficient of thermal expansion, thermal conductivity, electrical conductivity, or a combination. The first component is dispersed within a continuous phase of a second component that is a metal or alloy. The composite article is not "green," but is densified. The article can have a theoretical density of at least 80w, and other ratios, coefficients of thermal expansion, thermal conductivity values, and the like as described.

Other advantages, novel features, and objects of the invention will become apparent from the following detailed description of the invention when considered in conjunction with the accompanying drawings.

DETAILED DESCRIPTION OF THE INVENTION

The present invention provides techniques for forming densified, zero or low coefficient of thermal expansion (CTE) materials that have good thermal and/or electrical conductivity. The densified materials of the invention are to be contrasted with "green" samples, which would be understood by those of ordinary skill in the art to mean samples of only about 70–80% theoretical density in which the shape of individual particles that make up the composite articles of the invention is maintained and distinguishable. The densified materials of the invention are formed into a larger, integral, continuous matrix, in contrast to "green" materials; the shape of individual particles is observed to be lost, and structural strength is significantly higher. A "green" composite article, when dropped from a height of over about four feet, typically will fracture. Moreover, "green" samples, which have up to 30% void volume, will exhibit an accompanying loss of thermal conductivity of up to 30%.

The invention represents an improvement over typical prior art techniques resulting in "low" CTE materials having CTE of approximately 4.0 to about 7.0, or "ultra low" CTE materials having CTE of less than about 3 ppm (1 ppm=1× $10^{-6}$ $K^{-1}$; 1 ppm=1×$10^{-6}$/K). Low or ultra low prior art CTE materials typically have poor thermal conductivities. For example, a well known material, $Al_2O_3$, has a CTE of about 6.8 ppm, which is relatively low, but has a thermal conductivity of only about 10 W/m·K. Moreover, CTEs typically are temperature dependent, and advantageous CTE properties do not necessarily extend over wide temperature ranges.

The invention provides techniques for forming composite articles of components that are particularly sensitive to pressure, temperature, or a combination. One technique involves providing a material that undergoes a phase transformation, or decomposition, that affects certain properties when it is subjected to a threshold pressure, a threshold temperature, or a combination (a threshold pressure at a particular temperature), when it is provided homogeneously. "Provided homogeneously", as used in this context, means when the material is provided in particulate form or solid form without other materials present. That is, application of pressure to a material that is provided in particulate form by itself (provided homogeneously), will cause a phase transformation or decomposition disadvantageously affecting certain properties. The properties that are disadvantageously affected can be density, coefficient of thermal expansion, thermal conductivity, etc., or a combination. "A phase transformation, or decomposition" is meant to define appreciable transformation or decomposition, meaning a change that affects the overall properties of the material to the extent that one of ordinary skill in the are of assembly of such materials for use in components in precision optics or the like would consider the change relevant in material selection. In one set of embodiments the meaning of "appreciable phase transformation or decomposition" means transformation or decomposition in an amount of at least about 5%.

According to one set of embodiments, particles of material that undergoes an undesirable phase transformation or decomposition at a threshold pressure are substantially completely coated with a second component to form coated particles, and a composite article is formed from the coated particles. The composite can be formed by subjecting the coated particles to pressure, temperature, or a combination, with pressure or a combination of pressure and temperature being particularly useful.

Figure 1:
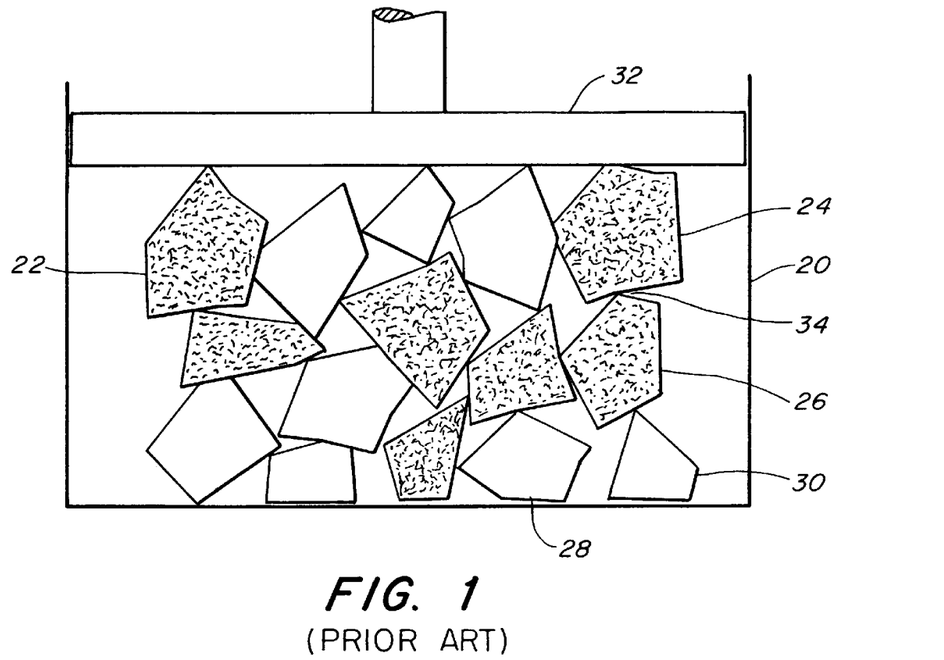
FIG. 1 illustrates, schematically, a prior art process for densification of a mixture of two powders in forming a composite article.

FIG. 1 illustrates, schematically, a container 20 containing a plurality of particles 22, 24, 26, 28, and 30. Particles 22, 24, and 26, each of a first component, are provided in a mixture including particles 28 and 30 of a second component. Other particles of the first and second components are present. The process that is illustrated schematically can represent a typical prior art process used to compact different components, in particulate form, to form a two-component composite article.

Application of a force to the mixture of particles via, for example, a press 32, will compact and densify the particles. However, where the first component undergoes a disadvantageous phase transformation or decomposition upon application of pressure, this phase transformation or decomposition can occur easily at locations such as location b 34 where a relatively sharp portion of particle 26 impacts upon particle 24. At the boundary between these particles a relatively high pressure can be generated upon application of force to the mixture of particles, resulting in phase transformation or decomposition at a localized region such as location 34.

Figure 2:
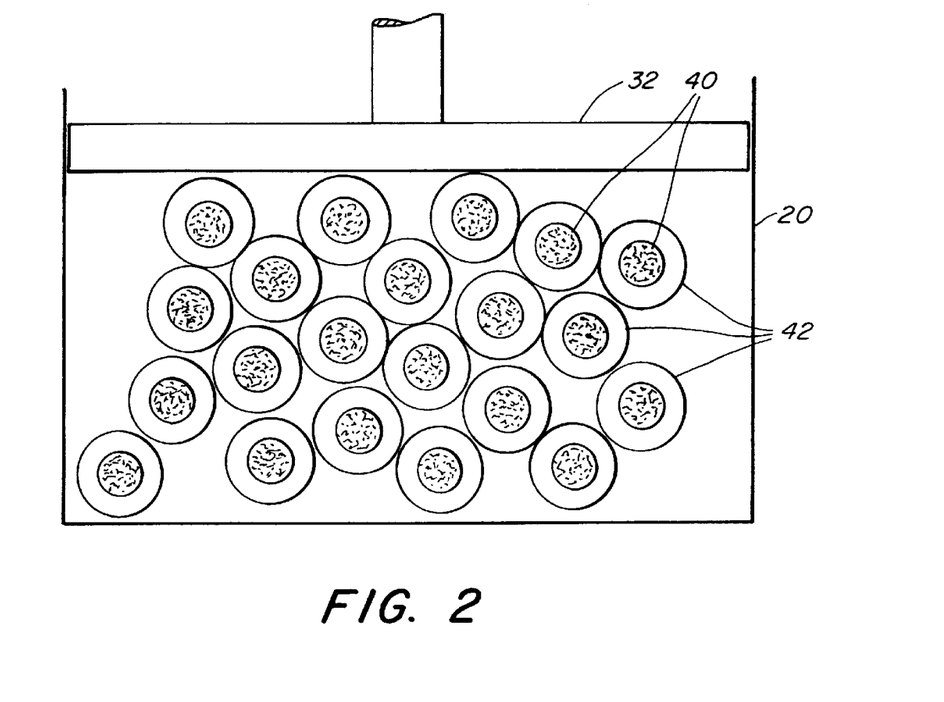
FIG. 2 illustrates, schematically, a process of the invention for densification of coated particles in forming a composite article.

The invention avoids this problem by providing a plurality of coated particles as illustrated in FIG. 2. In FIG. 2, container 20 includes a plurality of particles each including a core 40, formed of the first component that can undergo a disadvantageous phase transformation or decomposition upon application of a threshold pressure (the component of which articles 22, 24, and 26 of FIG. 1 are made), coated by a second component 42 (the component of which particles 28 and 30 of FIG. 1 are formed). Application of a force to the plurality of particles of FIG. 2, via press 32, results in compaction to form a relatively dense composite article including a discontinuous phase defined by separate particles of the first component, defined by core portions 40, dispersed within a continuous phase of the second component formed from the densification of the coating layers 42. Compaction and densification takes place essentially exclusively via high localized pressure experienced at interfaces between coatings 42 (interfaces between different portions of the second component) and the pressure experienced by cores 40 of the first component are not elevated by localized regions of low contact area. That is, the pressure experienced by cores 40 is essentially no more than the overall average pressure experienced by the entire plurality of particles within container 20. Thus, the composite is formed without disadvantageous phase transformation or decomposition of the first component.

Another advantage of the technique illustrated in FIG. 2 is that the ratio of the first component to the second component in the overall composite article can be carefully controlled by controlling the ratio of the second component to the first component in the particles, as described in U.S. Pat. No. 5,601,924 (Beane), noted above. In providing a coating in an amount sufficient to allow the composite article to be formed without phase transformation or decomposition of the first, coated component the ratio of the first to the second component can be controlled as well to create a composite article with a desired CTE. In some cases it may be desired that the CTE is near zero. In other cases, it may be desired that the CTE is a different value. For example, the first and second components can be provided in a ratio of between about 75:25 and 25:75, or between about 20:80 and about 80:20, or between about 30:70 and about 70:30 or, between about 40:60 and about 60:40.

Figure 3:
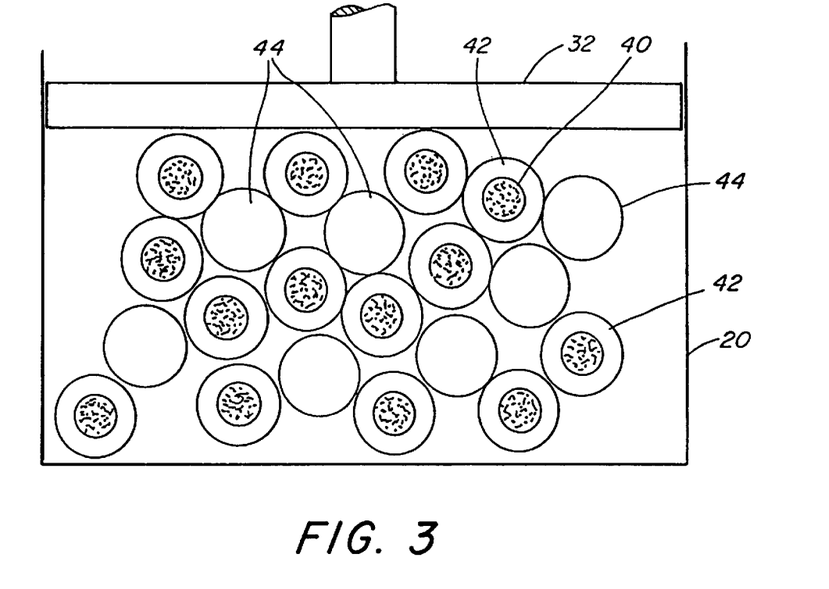
FIG. 3 illustrates, schematically, a process of the invention for densification of a mixture of coated and uncoated particles in forming a composite article.

FIG. 3 illustrates another embodiment of the invention in which a container 20 contains a plurality of coated particles each including a core 40 of the first, phase-transforming or decomposing component and a coating 42 of the second component, the coated particles admixed with a plurality of particles 44 of the second component only. Compaction of this mixture via application of a force by press 32 also results in a composite article including a discontinuous phase of the first component dispersed within a continuous phase of the second component, with the avoidance of any direct impact between particles of the first component. That is, in the techniques illustrated in each of FIGS. 2 and 3, during the entire compaction technique every isolated portion of the first component is shielded from compaction every other portion of the first component by a portion of the second component. This is particularly effective when the second, shielding component is more malleable than the first, coated component.

Compaction and densification of these materials takes place under conditions that allow breakage of the native oxide layer that exists on most metal particles, particularly the non-noble metals. In the case of copper, the native oxide layer can be broken chemically (via a reducing agent), thermally, mechanically, or a combination of these. Breakage of the native oxide layer is necessary for formation, form a plurality of individual particles, of a continuous matrix. Hot isostatic pressing uses a combination of heat and pressure. Sintering typically uses heat exclusively. The conditions to which a single material need be exposed to form a continuous matrix typically are well-known or easily derivable, relative to conditions for a mixture of materials, thus the coating technique is easily practiced, with the benefit of this disclosure, for a wide variety of materials.

A wide variety of combinations of first and second components can be used according to the techniques of the invention to form composite articles. As mentioned, the first component, when subjected to a threshold pressure at a particular temperature, undergoes a phase transformation or decomposition that affects a property such as density, coefficient of thermal expansion, thermal conductivity, or a combination. The threshold pressure and temperature conditions can be defined by those conditions of pressure and temperature at which the second component, which coats the first component is malleable and able to form a continuous matrix embedding the first component. That is, where a two-component matrix is desirably formed, screening tests can be used to determine suitable first and second components.

One screening test involves subjecting particles of the first component, without coating, to conditions of pressure and temperature at which the second, coating component is malleable enough to form a continuous matrix upon compaction. If, under those conditions, the first component undergoes disadvantageous phase transformation or decomposition, then the technique of the invention can be applied to avoid this phase transformation or decomposition.

Another screening test involves determining threshold conditions of temperature and pressure at which the most sensitive (the most unstable with respect to phase transformation or decomposition under the conditions) of the components undergoes the phase transformation or decomposition. Then, the second component is tested to determine whether it is malleable enough, under those conditions, to form a continuous matrix. If so, then the two components are good candidates for use in the technique of the invention, the first component being coated by the second component and the coated particles compacted to form a matrix. Those of ordinary skill in the art, with reference to standard texts and literature articles, can select many combinations of materials that fit these criteria. Typically the second, coating component 42 will be a metal such as copper, silver, aluminum, gold, iron, gallium, indium, thallium, tungsten, molybdenum, zinc, cadmium, nickel, palladium, platinum, or the like, and the first, coated component 40 will be a ceramic material. Negative CTE materials are complex structures that have very open structures, and generally are considered good candidates for pressure induced phase transformation or decompositions. Some are identified in Chu, et al., "Negative Thermal Expansion Ceramics: A Review", *Mat. Sci. and Eng.*, 95 (1987, 303–308. Negative CTE materials that are candidates include, without limitation, $La_2O_3$, $Nb_2O_5$, $TaVO_5$, $TaVO_5$—$WO_3$, $PbTiO_3$, $XW_2O_8$ (X=Zr, Hf), $HfO_2$—$TiO_2$, $LiO_2$—$Al_2O_3$—$SiO_2$.

In one set of particularly preferred embodiments, the first, coated component (core) is a ceramic that provides a desired CTE to an overall composite and the second, coating component is a metal that provides good thermal conductivity. Using this combination, a near zero or zero CTE material having high thermal conductivity can be provided. Metals that can form the second component can be selected among those mentioned above. The second, coating component, preferably has a relatively high thermal conductivity of at least about 100 W/m•K, more preferably at least about 150 W/m•K, more preferably at least about 175 W/m•K. The material should also have malleability, or ductility, as described above for the processing technique. Typically, cubic face-centered materials will work best. The second component also should be amenable to plating or coating the first component. For example, the second component should be amenable to electroless deposition if the first, coated component is a non-electrically-conductive material such as a ceramic. The second component also could be applied to the first component via sputtering, spraying, vapor deposition, or the like. Electroless (autocatalytic) plating processes or other coating processes are well-known, and some are described in U.S. Pat. No. 5,601,924, incorporated herein by reference. The second component also preferably has a relatively low melting point, preferably no more than about 1600° C. More preferably, the melting point is less than about 1400° C., more preferably less than about 1300° C., more preferably less than about 1200° C., and more preferably still less than about 1100° C.

The first, coated component typically is a material that phase transforms or decomposes during normal state-of-the-art fabrication techniques such as sintering, or hot isostatic pressing. The first, coated component typically is a ceramic. Preferred are those ceramics with negative CTEs, which can facilitate construction of a composite having low or zero CTE overall with a high thermal or electrical conductivity provided by the coating metal. Negative CTE ceramics are discussed by Chu, et al., In "Negative Thermal Expansion Ceramics: A Review", noted above. Most preferred are those components having a CTE of less than $3 \times 10^{-6}$/K. According to this set of preferred embodiments the CTE of the first component preferably is less than about $1 \times 10^{-6}$/K, more preferably less than $-1 \times 10^{-6}$/K, more preferably than about $-3 \times 10^{-6}$/K, and more preferably less than about $-5 \times 10^{-6}$/K, more preferably still less than about $-7 \times 10^{-6}$/K, and most preferably those with CTE less than or equal to about $-9 \times 10^{-6}$/K. By combining a low to negative CTE material with a positive CTE, high thermal conductivity material, a composite can be formed having good thermal conductivity and an overall zero or low CTE of between about $-03 \times 10^{-6}$/K and about $7 \times 10^{-6}$/K, preferably between about $-1 \times 10^{-6}$/K and about $4 \times 10^{-6}$/K, more preferably between about $-1.0 \times 10^{-6}$/K and about $0.5 \times 10^{-6}$/K, more preferably still between about $-0.2 \times 10^{-6}$/K and about $0.2 \times 10^{-6}$/K.

Figure 5:
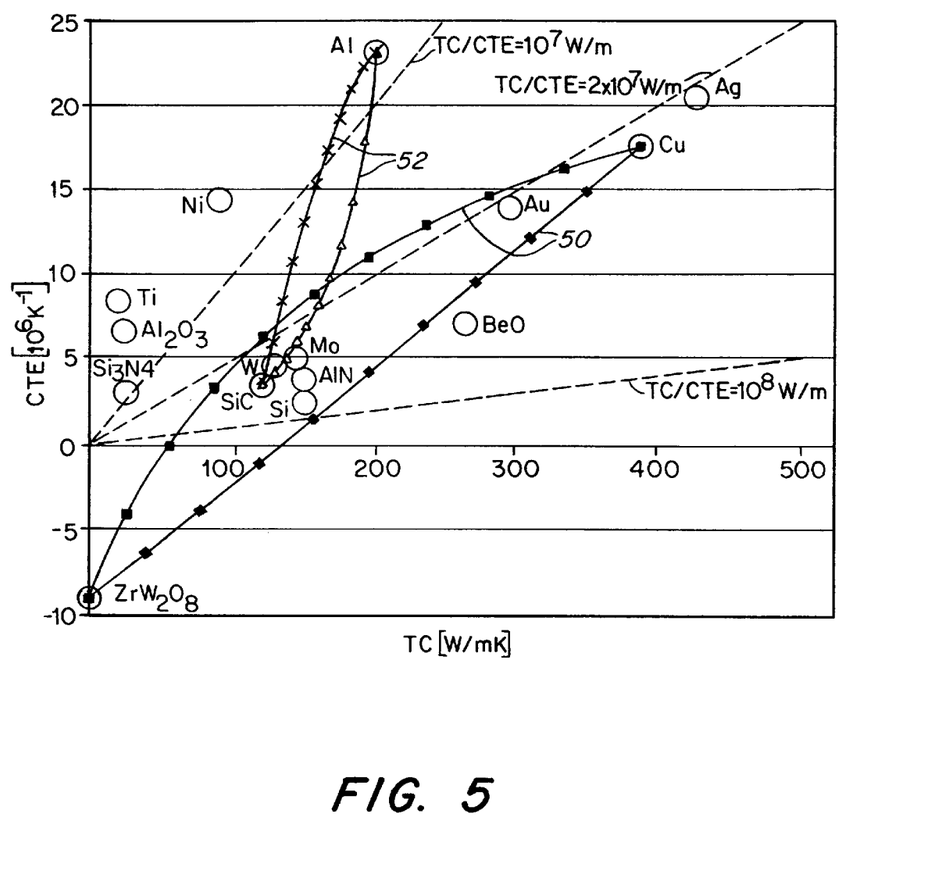
FIG. 5 shows actual CTEs and thermal conductivities of various materials, and model-predicted properties of composites.

Particularly preferred as the first, coated component are the ceramics $XW_2O_8$, where X=Zr, Hf, or a combination. These materials show remarkably low (negative) CTEs, and undergo phase transformation or decomposition disadvantageously affecting CTE during state-of-the-art composition processing techniques. These materials, therefore, benefit particularly from the technique of the invention, and advantageously are provided in composites with metals such as those described above, preferably copper, silver, or a combination. Such a composite possesses a very advantageous overall combination of CTE and thermal conductivity, as can be seen from FIG. 5. FIG. 5 compares CTE and thermal conductivity of a $ZrW_2O_8$/copper matrix over an entire range of composition from pure ceramic to pure metal, demonstrated as curve 50, determine theoretically, compared with that of a common composite silicon carbide/aluminum, curve 52. The determination of curve 50 is described in greater detail below in Example 1.

The negative CTE of $ZrW_2O_8$ exists over a wide range of temperature, as can be demonstrated by neutron diffraction and dilatometery measurements. A physical explanation for this unusual behavior has been based on the expansion of a sublattice and the simultaneous contraction of the other sublattice for steric reasons. Compared to other ceramics showing a negative CTE, $ZrW_2O_8$ shows an isotropic negative CTE over an exceptionally large temperature range (0.3–1050 K) and with an exceptionally large magnitude ($-8.7 \times 10^{-6}$ $K^{-1}$ between 0.3 and 428 K). However, $ZrW_2O_8$ is only thermodynamically stable over a narrow temperature range around 1400 K, and is metastable at ambient pressures up to 1050° C., where it decomposes into $ZrO_2$ and $WO_3$. Furthermore, $ZrW_2O_8$ undergoes an order-disorder transformation at 428 K from its metastable, low-temperature, cubic phase ($\alpha$-$ZrW_2O_8$) to a metastable, high-temperature, phase ($\gamma$-$ZrW_2O_8$) with a CTE of $-4.9 \times 10^{-6}$ $K^{-1}$. Also, at pressures of 2 kbar at room temperature, the cubic structure low-pressure phase ($\alpha$-$ZrW_2O_8$) transforms to an orthorhombic high-pressure phase ($\gamma$-$ZrW_2O_8$) with a CTE of $-1.2 \times 10^{-6}$ $K^{-1}$. While $\gamma$-$ZrW_2O_8$ remains metastable at room temperature when the pressure is released, it can be converted back to cubic $\alpha$-$ZrW_2O_8$ by heating at 393 K at ambient pressure.

Figure 4:
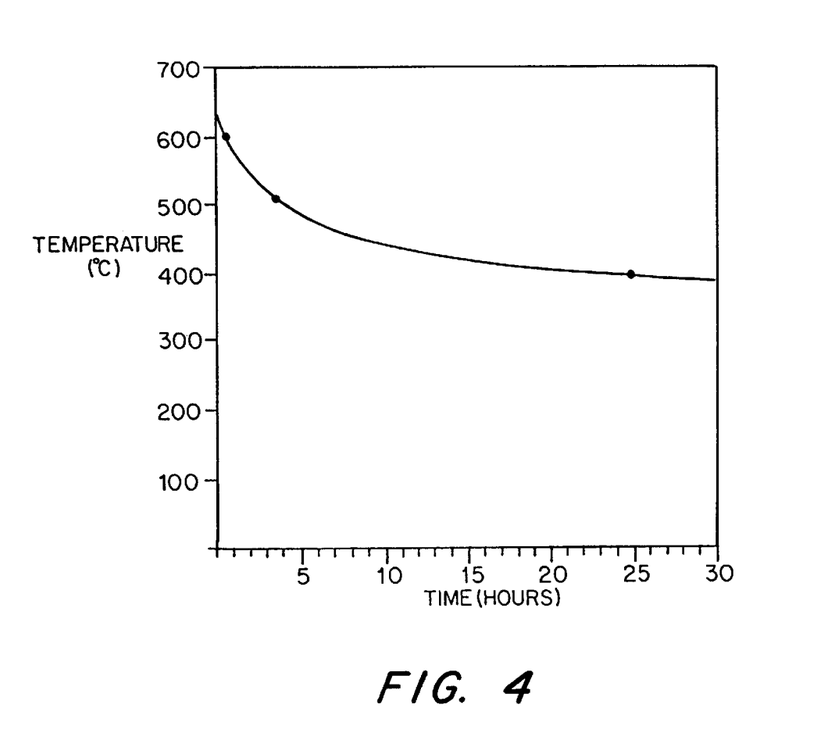
FIG. 4 is a graph showing identified conditions for processing a mixture of particles of a negative CTE material and a metal.

According to another set of embodiments, formation of a matrix including a discontinuous, $XW_2O_8$ (X=Zr, Hf, or a combination) in a continuous, highly thermally-conductive metal matrix such as the metals described above or, preferably, copper or silver, can be formed using a technique other than the coated particle technique of FIGS. 2 and 3 and related discussion. The present invention involves, according to this set of embodiments, a particular time/temperature processing window within which these components, first processed via hot pressing or hot isostatic pressing, can be heated under vacuum. As discussed more fully below in Example 3, samples were processed, and then treated under vacuum at 400° C. for up to 24 hours, at 500° C. for up to 3 hours, and at 600° C. for 30 minutes. Under these conditions decomposition of $XW_2O_8$ was minimal or did not occur. Thus, the invention involves a method including heat treating a metal and $XW_2O_8$ under processing conditions sufficient to cause annealing but no more than an approximate boundary condition including about 400° C. for up to about 24 hours, about 500° C. for up to about 3 hours, and about 600° C. for up to about 30 minutes. This approximate boundary condition is shown schematically in FIG. 4. Based upon this description, the detailed description in Example 3 below, and with reference to FIG. 4, those of ordinary skill in the art will understand the meaning of "under processing conditions sufficient to cause annealing but no more than an approximate boundary condition including about 400° C. for up to about 24 hours, about 500° C. for up to about 3 hours, and about 600° C. for up to about 30 minutes."

The function and advantage of these and other embodiments of the present invention will be more fully understood from the examples below. The following examples are intended to illustrate the benefits of the present invention, but do not exemplify the full scope of the invention.

EXAMPLE 1

Determination Of Coefficient of Thermal Expansion of $Cu/ZrW_2O_8$ Composites

Modeling:

Modeling of the thermal expansion coefficient of $Cu/ZrW_2O_8$ Composites was done using a known analysis (Kerner: E. H. Kerner, Proc. Phys. Soc., B69 (1969), 808; F. S. Turner, J. Res. Nat. Bur. Stand., 37 (1946), 249). By consideration of pure elastic interaction between the reinforcement and the matrix the Kerner model:

$$ac = am - Vr*(am - ar)*$$

$$\frac{Km*(3Kr+4Gm)^2 + (Kr-Km)*(16Gm^2+12Gm*Kr)}{(4Gm+3Kr)*(4Vr*Gm*(Kr-Km)+3Kr*Km+4Gm*Km)}$$

GM: matrix shear modulus
predicted a value 60% ceramic prediction (CTE: $3.4 \times 10_{-6}$/K), and the Turner model:

$$ac = \frac{am*Vm*Km + ar*Vr*Kr}{Vm*Km + Vr*Kr}$$

ai: CTE of ith phase,
Vi: volume fraction of ith phase
Ki: bulk modulus of ith phase
c: composite
r: reinforcement
m: matrix
a value of $6.2 \times 10^{-6}$/K for a composite containing 60 Vol % $ZrW_2O_8$ in a pure Cu matrix. For the temperature region above the transformation temperature of $ZrW_2O_8$ (155° C.) the values are $5.6 \times 10^{-6}$/K$^-$ and $7.9 \times 10^{-6}$/K, respectively.

Since the difference in CTE between Cu and $ZrW_2O_8$ is quite large (26.6 ppm) not only elastic interaction is going on but also plastic deformation. For this reason the stresses in the composites were modeled to see if they exceed the yield stress of the matrix and thus cause plastic deformation. For modeling, some basic assumptions are made: the particles used as reinforcement are considered as spheres with 25 microns diameter, the temperature for the stress free state is chosen to be 400° C. That means annealing at this temperature leads to a stress free composite and cooling down to room temperature creates a stress state which is primarily tensile within the matrix and compressive within the particle. In order to predict the temperature drop in which the material shows no macroplasticity we looked at the evolving plastic zone around the particle. The thickness of the plastic zone around a ceramic particle is given by the following equation (Lee et al. Met. Trans. Vol. 11A, (1980), 1837–47):

$$rp = a * \exp\left(\frac{\delta r}{2 * \delta y} - \frac{1}{3}\right)$$

rp: radius of the plastic zone
a: radius of particle
δr: radial stress at the particle-matrix interface
δy: yield strength of the matrix The thickness of the plastic zone is a function of the temperature drop from 400° C. considering a temperature dependant yield strength for Cu. Macroplasticity appears by an interconnection of the individual plastic zones, which is the case at a drop of 45 K For a composite at room temperature the stress state is as follows: the particle is in hydrostatic compression and the matrix is in tension. Since the matrix stresses are not purely hydrostatic yielding occurs and the hydrostatic stress in the particle depends on the yield strength of the matrix.

Experimental Conditions

In examples 2–5 chemical reactivity, thermal decomposition, phase transformations, creep and mismatch stresses of copper-zirconium tungstate composites developed for applications with low CTE and high thermal conductivity were examined from the point of view of powder-metallurgy processing of these composites. The effects of these phenomena on the composite microstructure and thermal expansion are determined.

Materials: Copper powders (99.5% pure, grain size between 45 μm and 63 μm, from Cerac Inc., Milwaukee, Wis.) and $ZrW_2O_8$ powders (crushed to match the size of the copper powders, from Teledyne Wah Chang, Albany, Oreg.) were used to produce mixtures with 50 vol % zirconium tungstate content, in examples using mixtures of uncoated particles.

Hot isostatic pressing was carried out at 100 MPa. Hot pressing was carried out at 1400 MPa.

EXAMPLE 2

Comparative: Uniaxial and Cold Isostatic Pressing of powders of Cu and $ZrW_2O_8$ Followed By Heat Treatment An attempt was made to form a Cu/$ZrW_2O_8$ composite having zero or low CTE and high thermal conductivity using cold pressing techniques followed by heat treatment.

Powder of $ZrW_2O_8$ and Cu was uniaxially pressed to a density typically of 70%. Cold isostatically pressed samples had a density up to 90%. In each case, the pressed samples were not densified, but showed only a green strength.

Annealing (400° C., 1 hr, vacuum) after uniaxial pressing did not result in significantly higher densities, but the samples remained green.

Heat treatment studies on CIPed samples were done in vacuum at 400° C. for up to 24 hrs, at 500° C. for up to 3 hrs, at 600° C. for 30 min and at 700° C. for 15 min. While α-$ZrW_2O_8$ resulted, the samples were not densified (were of green strength), thus were not useful for most applications.

EXAMPLE 3

Conditions For Production of Zero to Low CTE, Highly Thermally Conductive Densified Composite Via Hot Pressing or Hot Isostatic Pressing of Powders of Cu and $ZrW_2O_8$, Followed By Heat Treatment A window of conditions was determined within which uncoated powders of Cu and $ZrW_2O_8$ could be processed to zero or low CTE, highly thermally conductive composites.

Densified samples were obtained by Hot Pressing blended powders under a uniaxial pressure of 1.4 GPa at 250° C. for 13 hrs under vacuum. Another set of powders was HIPed (Hot Isostatic Pressed) at 500° C. for 3 hrs under a pressure of 100 MPa. Densified, hot pressed and HIPed samples were heat treated under vacuum at 400° C. for up to 24 hrs, at 500° C. for up to 3 hrs, at 600° C. for 30 min and at 700° C. for 15 min. Under hydrogen atmosphere studies were done at 400° C. and 500° C. for 1 hr, where no reaction between $ZrW_2O_8$ and Cu was observed in the XRD pattern. In the case of a heat treatment at 700° C. for 15 min the major peaks of $ZrW_2O_8$ vanished, indicating decomposition. In all other cases, any γ-$ZrW_2O_8$ that was formed could be at least in part reconverted to α-$ZrW_2O_8$ thermally, at temperatures of no more than about 400° C., for example for 200 hrs at 400° C.

Thus a window of processing conditions sufficient to cause annealing but no more than that causing unacceptable phase decomposition was established. The window of processing conditions includes those conditions of temperature and pressure sufficient to cause annealing but no more than an approximate boundary condition including about 400° C. for up to about 24 hours, about 500° C. for up to about 3 hours, and about 600° C. for up to about 30 minutes.

EXAMPLE 4

Low to Zero CTE, Densified, Highly Thermally Conductive Composite From Hot Isostatic Pressing of Cu-coated $ZrW_2O_8$ Powder Low to zero CTE, densified, highly thermally conductive composites of a metal component having high thermal conductivity and a positive CTE, and a second component having a negative coefficient of thermal expansion, were formed by coating particles of the second component with the metal component to form coated particles and then processing the particles $ZrW_2O_8$ powder was plated with copper at a thickness from 0.5 to 2 microns (electroless Cu solutions from Fidelity Chemical Products Corp. Newark, N.J.) and was HIPed (Hot Isostatic Pressed) at 482° C. for 3 hrs under a pressure of 102 MPa, which resulted in a densified material of very high theoretical density. Increased density was achieved, with essentially no phase decomposition of $ZrW_2O_8$.

X-ray diffractometry investigations were done using Cu Kα radiation. CTE measurements were done on fully densified hot-pressed composites (rods: 9 mm diameter and approx. 10 mm in length) using a dilatometer.

Discussion of Results

Figure 6:
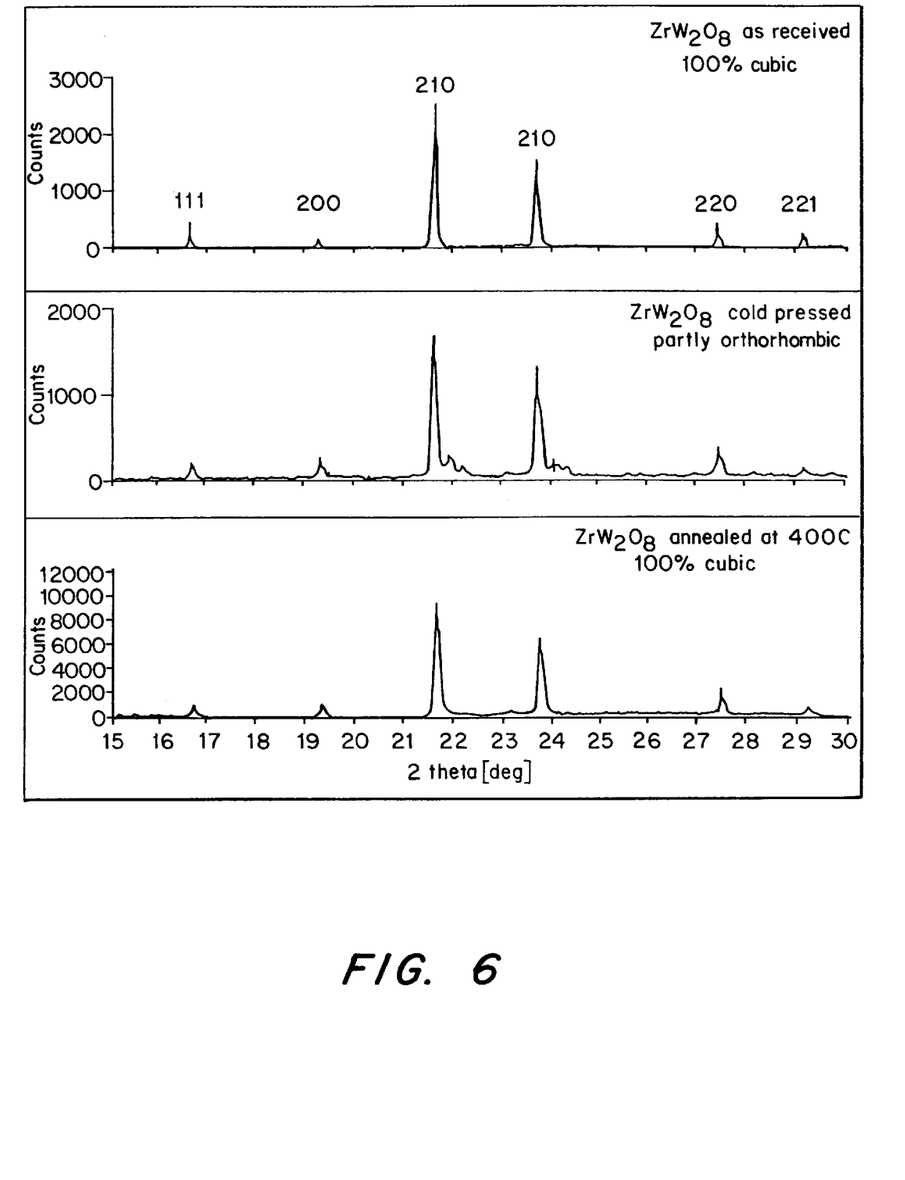
FIG. 6 shows x-ray diffractometry (XRD) patterns of as received, cold pressed, and annealed $ZrW_2O_8$ powders.

During CIPing $ZrW_2O_8$ is partially transformed to the high pressure phase (γ-$ZrW_2O_8$) which remains metastable after removing the pressure. A heat treatment at 400° C. for 15 min under vacuum reconverts the ceramic phase in a green specimen to α-$ZrW_2O_8$ (FIG. 6).

Figure 7:
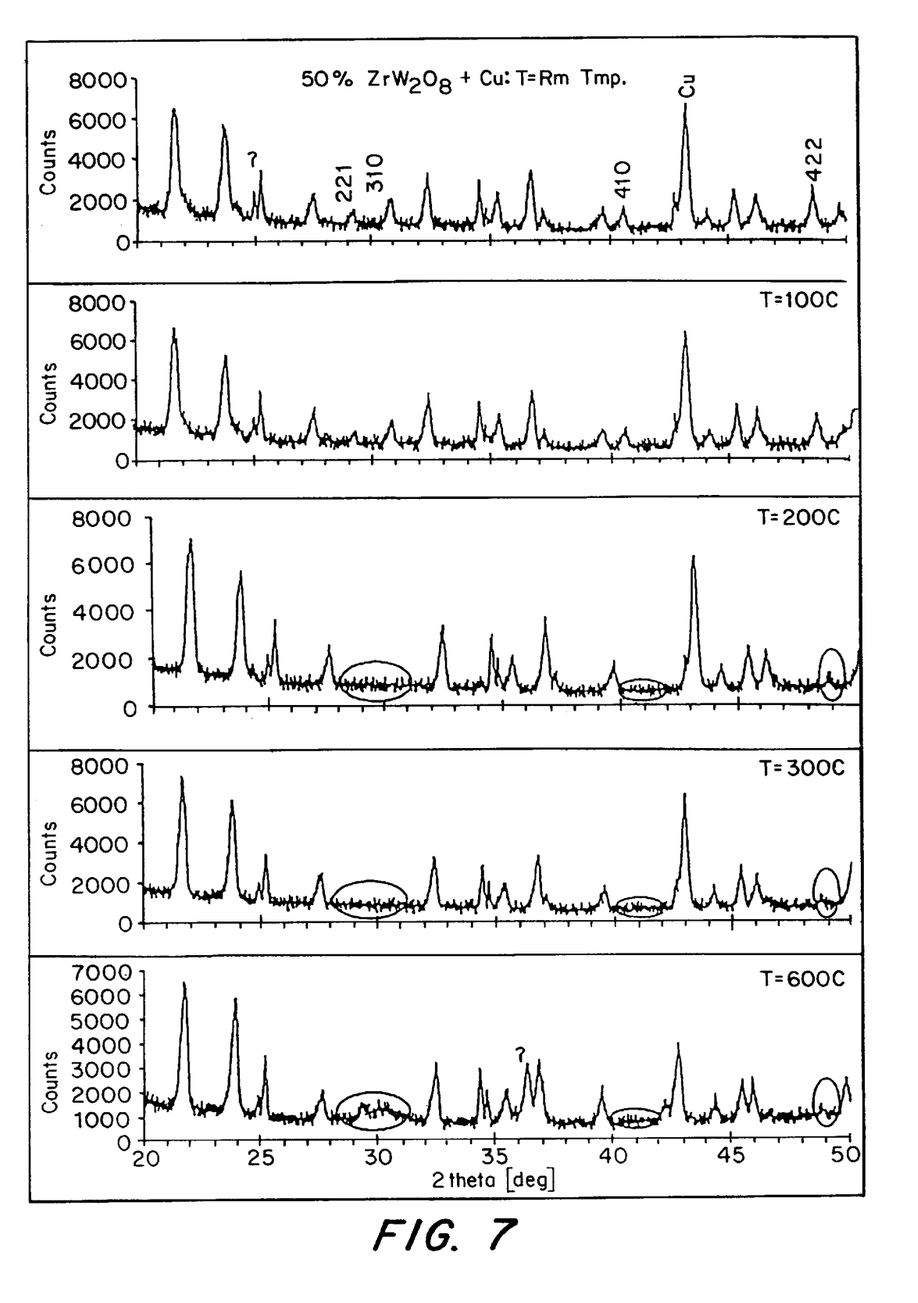
FIG. 7 shows XRD patterns of mechanically-alloyed $ZrW_2O_8$ powders at different temperatures.

Heat treatment studies were done to show a time-temperature processing window for Cu/$ZrW_2O_8$ composites within which disadvantageous phase transformation or decomposition to form undesirable products did not occur. Investigations on the temperature stability (done by high temperature x-ray investigations) of the mixed powders show that there is no disadvantageous phase transformation or reaction between Cu and $ZrW_2O_8$ up to 600° C. if the processing times are kept short. The diffraction pattern in FIG. 7 was obtained by heating at a rate of 20 C/min, holding for 1 min at the desired temperature (100° C., 200° C., 300° C. and 600° C.) and doing the measurement for 7.5 min under vacuum. A phase transformation can also be observed in the diffraction pattern, which is indicated by the vanishing 221, 310, 410 and 422 peaks between 100 and 200° C.

Figure 8:
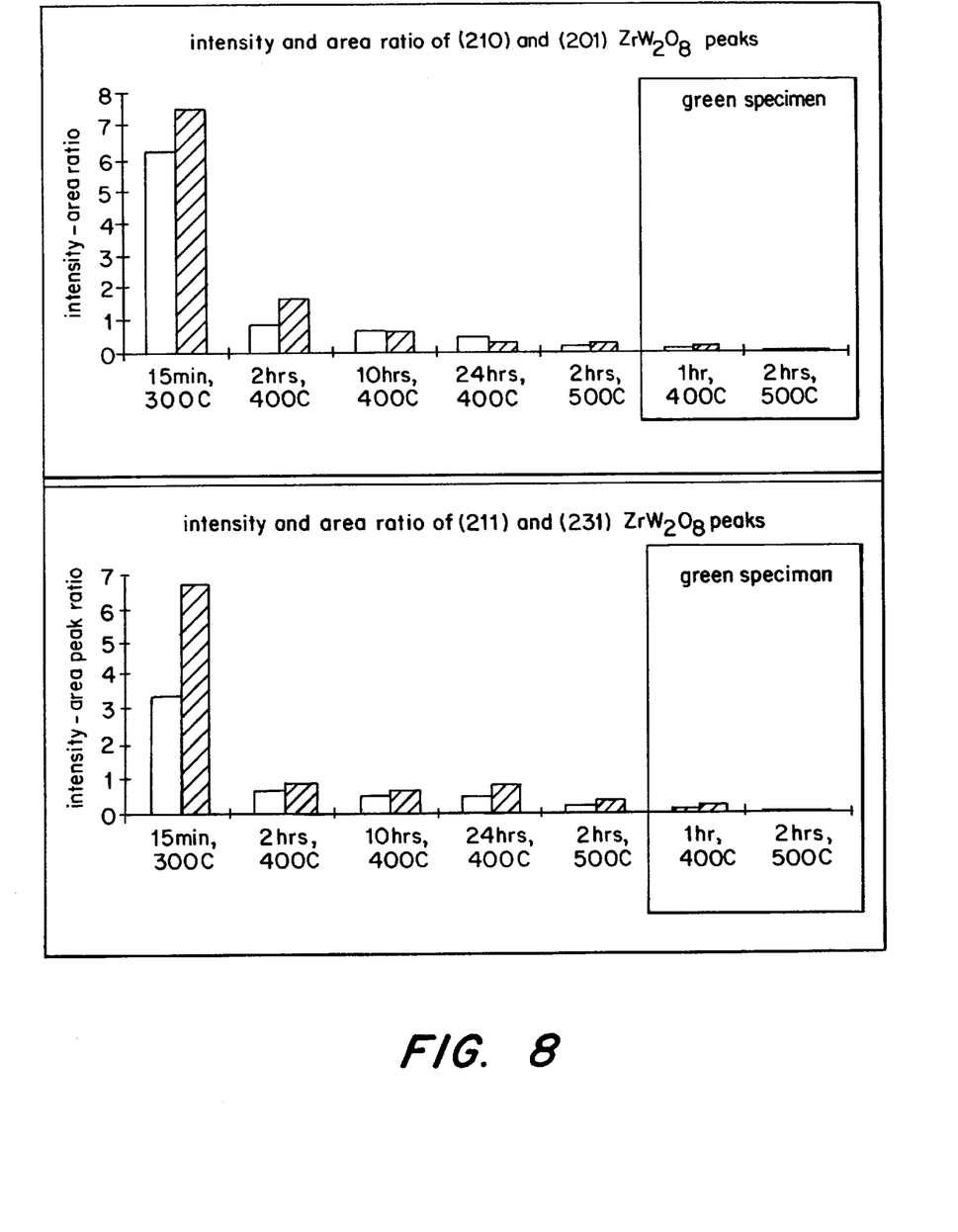
FIG. 8 shows the ratio (intensity and area) of the two main peaks of $\gamma$-$ZrW_2O_8$/$\alpha$-$ZrW_2O_8$ after various heat treatments of the composite.

During the compaction process $\alpha$-$ZrW_2O_8$ is partially transformed to the high pressure phase $\gamma$-$ZrW_2O_8$ which is metastable at RT and atmospheric pressure. The amount of transformed $ZrW_2O_8$ depends on the compaction pressure and more specifically on the formation of very high local stresses. Due to the comparatively higher CTE of $\gamma$-$ZrW_2O_8$, compared to $\alpha$-$ZrW_2O_8$ ($-1.16*10^{-6}$ $K^{-1}$)reconversion from the gamma phase to the alpha phase is highly desirable. Back transformation from $\gamma$-$ZrW_2O_8$ to $\alpha$-$ZrW_2O_8$ reportedly takes place at 153° C. and atmospheric pressure. To observe the back transformation fully densified samples, $ZrW_2O_8$ powders and CIPed samples were heat treated and afterwards examined by x-ray diffraction. As a measure for the fraction of transformed $ZrW_2O_8$ the ratios of the two main peaks (intensity and area) of $\alpha$-$ZrW_2O_8$ (210, 211) and $\gamma$-$ZrW_2O_8$ (201, 231) are used. FIG. 8 shows the intensity and area ratio of these peaks after different heat treatments. To get a significant reduction in the high pressure phase content it was determined that a heat treatment of at least 400° C. was necessary. With increasing time at constant temperature the high pressure phase decreased. A difference in annealing between fully densified bulk composite, a green bulk composite and powders was observed. Whereas green composites and powders showed nearly no remaining high pressure phase ($\gamma$-$ZrW_2O_8$) after a heat treatment at 400° C. for 24 hrs, densified samples could showed some remaining $\gamma$-$ZrW_2O_8$ after reconversion conditions. These annealing and reconversion conditions for the densified samples were determined to define a window of conditions in which at least some reconversion to $\gamma$-$ZrW_2O_8$ was possible, and the conditions did not result in irreversible decomposition. Thermal cycling resulted in back and forth interconversion between $\gamma$-$ZrW_2O_8$ to $\alpha$-$ZrW_2O_8$. Thus the invention involves, in one aspect, the determination that back transformation is mechanically hindered by the copper matrix, and the copper-coated ceramic embodiment is most advantageous.

By processing the composite via the HIP routine the amount of $\gamma$-$ZrW_2O_8$ was significantly lower than by processing via the hot pressing routine. The main reason being the lower compaction pressure, which is only 100 MPa during HIP compared to 1400 MPa in case of hot pressing.

Those skilled in the art would readily appreciate that all parameters listed herein are meant to be exemplary and that actual parameters will depend upon the specific application for which the methods and apparatus of the present invention are used. It is, therefore, to be understood that the foregoing embodiments are presented by way of example only and that, within the scope of the appended claims and equivalents thereto, the invention may be practiced otherwise than as specifically described.

What is claimed is:

1. A method of forming a composite article, comprising:
   providing a ceramic component having a CTE of less than $3\times10^{-6}$/K that, when provided homogeneously and subjected to conditions of a threshold pressure at a set temperature, undergoes a phase transformation or decomposition affecting density, coefficient of thermal expansion, thermal conductivity, electrical conductivity or a combination;
   substantially completely coating particles of the ceramic component with a second component to form coated particles; and
   forming a densified composite article from the coated particles.

2. A method as in claim 1, wherein the second component is selected from the group consisting of copper, silver, aluminum, gold, iron, gallium, indium, thallium, tungsten, molybdenum, zinc, cadmium, palladium, platinum, or nickel, or a combination.

3. A method as in claim 1, wherein the ceramic component has a negative coefficient of thermal expansion.

4. A method of forming a composite article, comprising:
   providing a ceramic component selected from the group consisting of $La_2O_3$, $Nb_2O_5$, $TaVO_5$, $TaVO_5$—$WO_3$, $PbTiO_3$, $XW_2O_8$ where X is Zr, Hf, or a mixture, $HfO_2$—$TiO_2$, and $LiO_2$—$Al_2O_3$—$SiO_2$ that, when provided homogeneously and subjected to conditions of a threshold pressure at a set temperature, undergoes a phase transformation or decomposition affecting density, coefficient of thermal expansion, thermal conductivity, electrical conductivity or a combination;
   substantially completely coating particles of the ceramic component with a second component to form coated particles; and
   forming a densified composite article from the coated particles.

5. A method as in claim 1, wherein the second component is Ag or Cu and the ceramic component is $XW_2O_8$, where X is Zr, Hf, or a mixture.

6. A method as in claim 1, wherein the ceramic component is $XW_2O_8$, where X is Zr, Hf, or a mixture and the second component is Cu.

7. A method as in claim 6, wherein the coated particles have a ratio of the ceramic component to the second component between about 20:80 and about 80:20.

8. A method as in claim 1, wherein the second component is a metal or alloy.

9. A method as in claim 1, wherein the ceramic component, when provided homogeneously and subjected to conditions of a threshold pressure at a set temperature, undergoes appreciable phase transformation.

10. A method as in claim 1, wherein the ceramic component, when provided homogeneously and subjected to conditions of a threshold pressure at a set temperature, undergoes appreciable decomposition.

11. A method as in claim 1, wherein the ceramic and second components are provided in a ratio of between about 20:80 and about 80:20.

12. A method as in claim 1, wherein the ceramic and second components are provided in a ratio of between about 30:70 and about 70:30.

13. A method as in claim 1, wherein the ceramic and second components are provided in a ratio of between about 40:60 and about 60:40.

14. A method as in claim 1, wherein the ceramic and second components are provided in a ratio about 50:50.

15. A method as in claim 1, wherein the ceramic component has a CTE less than about $1\times10^{-6}$/K.

16. A method as in claim 1, wherein the ceramic component has a CTE less than about $-1\times10^{-6}$/K.

17. A method as in claim 1, wherein the ceramic component has a CTE less than about $-3\times10^{-6}$/K.

18. A method as in claim 1, wherein the ceramic component has a CTE less than about $-5\times10^{-6}$/K.

19. A method as in claim 1, wherein the ceramic component has a CTE less than about $-7\times10^{-6}$/K.

20. A method as in claim 1, wherein the ceramic component has a CTE less than or equal to about $-9 \times 10^{-6}$/K.

21. A method as in claim 1, comprising forming a densified composite article having a theoretical density of at least about 90%.

22. A method as in claim 1, wherein the second component has a thermal conductivity of at least about 100 W/m·K.

23. A method as in claim 1, wherein the second component has a thermal conductivity of at least about 150 W/m·K.

24. A method as in claim 1, wherein the second component has a thermal conductivity of at least about 175 W/m·K.

25. A method as in claim 1, comprising forming the densified composite article by subjecting the coated particles to hot isostatic pressing conditions.

26. A method as in claim 1, wherein the ceramic component, when provided homogeneously, undergoes a phase transformation or decomposition affecting density, coefficient of thermal expansion, thermal conductivity, electrical conductivity or a combination at a minimum threshold temperature of less than 1000° C., at atmospheric pressure in air.

27. A method as in claim 1, wherein the ceramic component, when provided homogeneously, undergoes a phase transformation or decomposition affecting density, coefficient of thermal expansion, thermal conductivity, electrical conductivity or a combination at a minimum threshold temperature of less than 900° C., at atmospheric pressure in air.

28. A method as in claim 1, wherein the ceramic component, when provided homogeneously, undergoes a phase transformation or decomposition affecting density, coefficient of thermal expansion, thermal conductivity, electrical conductivity or a combination at a minimum threshold temperature of less than 800° C., at atmospheric pressure in air.

29. A method of forming a composite article, comprising:

providing a ceramic component that, when provided homogeneously and subjected to conditions of a threshold pressure at a set temperature undergoes a phase transformation or decomposition affecting density, coefficient of thermal expansion, thermal conductivity, electrical conductivity or a combination at a minimum threshold temperature of less than 780° C., at atmospheric pressure in air;

substantially completely coating particles of the ceramic component with a second component to form coated particles; and forming a densified composite article from the coated particles.

30. A method as in claim 1, wherein the ceramic component has a negative CTE and the second component has a positive CTE, the composite article having an overall CTE of between about $-3 \times 10^6$/K and about $3 \times 10^6$/K.

31. A method as in claim 1, wherein the ceramic component has a negative CTE and the second component has a positive CTE, the composite article having an overall CTE of between about $-1 \times 10^6$/K and about $1 \times 10^6$/K.

32. A method as in claim 1, wherein the ceramic component has a negative CTE and the second component has a positive CTE, the composite article having an overall CTE of between about $-0.5 \times 10^6$/K and about $0.5 \times 10^6$/K.

33. A method as in claim 1, wherein the ceramic component has a negative CTE and the second component has a positive CTE, the composite article having an overall CTE of between about $-0.2 \times 10^6$/K and about $0.2 \times 10^6$/K.

* * * * *